United States Patent [19]
Shah et al.

[11] Patent Number: 5,208,169
[45] Date of Patent: May 4, 1993

[54] METHOD OF FORMING HIGH VOLTAGE BIPOLAR TRANSISTOR FOR A BICMOS INTEGRATED CIRCUIT

[75] Inventors: Rajiv R. Shah; Stephen A. Keller, both of Sugar Land, Tex.

[73] Assignee: Texas Instruments Incorporated, Dallas, Tex.

[21] Appl. No.: 724,574

[22] Filed: Jun. 28, 1991

[51] Int. Cl.$^5$ .......................................... H01L 21/265
[52] U.S. Cl. ........................................ 437/31; 437/75; 437/76; 437/26; 437/909; 148/DIG. 11
[58] Field of Search ............... 437/26, 31, 74, 75, 437/76, 909, 31; 357/43, 34; 148/DIG. 11

[56] References Cited

U.S. PATENT DOCUMENTS

| | | | |
|---|---|---|---|
| 4,272,307 | 6/1981 | Mayrand | 437/76 |
| 4,525,922 | 7/1985 | Kiriseko | 437/31 |
| 4,879,255 | 11/1989 | Deguchi et al. | 437/59 |
| 4,997,775 | 3/1991 | Cook et al. | 437/31 |
| 5,116,777 | 5/1992 | Chan et al. | 437/59 |

FOREIGN PATENT DOCUMENTS 0054522 2/1990 Japan ........................... 437/31

*Primary Examiner*—Brian E. Hearn
*Assistant Examiner*—Tuan Nguyen
*Attorney, Agent, or Firm*—Gary C. Honeycutt; Richard L. Donaldson; William E. Hiller

[57] ABSTRACT

A high voltage bipolar transistor (10) is fabricated in an N− HV/epitaxial well (12) formed by an N− substrate implant and the overlying portion of the N− epitaxial layer 12b. The N− substrate implant replaces the normal buried N+ collector layer, in effect extending the depth of the epitaxial layer to increase junction breakdown voltages. The collector is formed by buried N+ collector regions (14a and 14b) formed adjacent to, and on either side of, the N− substrate implant. The transistor is fabricated conventionally in the N− HV/epitaxial well, except that, to further enhance high voltage performance, P+ extrinsic base regions (23a and 23b) can be extended using optional deep P+ implants (reducing curvature effects which correspondingly reduces electric field, and thereby inhibits premature junction breakdown).

12 Claims, 2 Drawing Sheets

METHOD OF FORMING HIGH VOLTAGE BIPOLAR TRANSISTOR FOR A BICMOS INTEGRATED CIRCUIT

TECHNICAL FIELD OF THE INVENTION

The invention relates generally to BICMOS integrated circuits, and more particularly relates to a high voltage bipolar transistor for a BICMOS integrated circuit, and a method of fabrication. In even greater particularity, the high voltage transistor is fabricated in an epitaxial layer that overlies a doped well in the substrate that is comparable in dopant concentration to the epitaxial layer, effectively extending the depth of the epitaxial layer and thereby significantly increasing the collector-base, collector-emitter, and collector-substrate breakdown voltage.

CROSS REFERENCE TO RELATED CASE

The subject matter of both the following coassigned Patent and copending U.S. patent application is incorporated by reference: U.S. Pat. No. 4,962,053, entitled "Bipolar Transistor Fabrication Utilizing CMOS Techniques, Issued Oct. 9, 1990; and Ser. No. 481,804, entitled "Integrated Bipolar and CMOS Transistor Fabrication Process", filed Feb. 20, 1990.

BACKGROUND OF THE INVENTION

BICMOS integrated circuit technology combines bipolar and CMOS transistors in the same integrated circuit. The bipolar transistors have a higher power rating than typical CMOS transistors, which is useful for some circuit applications.

Without limiting the scope of the invention, this background information is provided in the context of a specific problem to which the invention can be applied: fabricating a BICMOS integrated circuit with bipolar transistors having relatively higher collector-emitter, collector-base, and collector substrate breakdown voltages than the normal BICMOS bipolar transistors. The two types of bipolar transistors will be designated as HV (high voltage) and LV (low voltage).

To date, high-performance BICMOS technology has been directed toward conventional 5V digital applications. However, certain applications—such as high voltage analog and high power—require bipolar transistors with a relatively higher breakdown voltage than available using conventional BICMOS fabrication techniques.

In conventional BICMOS fabrication, assuming a P-type substrate, bipolar transistors are fabricated in an N− epitaxial layer with a relatively low dopant concentration formed over a buried N+ region of the substrate that has been implanted with a relatively high dopant concentration. P+ intrinsic/extrinsic base regions are formed in the surface of the N− epitaxial layer, and the emitter is formed by N-doped polysilicon deposited over the base regions—the collector is formed by the underlying N− epitaxial and buried N+ regions.

The avalanche breakdown voltages for the base-collector junction and the collector-substrate junction are inversely proportional to the dopant concentration in the buried N+ collector region. Thus, the relatively high dopant concentration of that region results in a relatively low junction breakdown voltages—typically on the order of 7-10 volts for the collector-emitter, 15-20 for the collector-base, and 25-35 for the collector-substrate. Nevertheless, the relatively high dopant concentration is used to reduce collector resistance and enhance performance.

An additional factor that limits junction breakdown voltages for bipolar transistors is the profile of the base regions. In conventional bipolar fabrication, the base regions have a relatively shallow profile to decrease the emitter-base transit time, thereby increasing the transistor switching speed. However, this base profile enhances base-junction curvature effects as biases are increased for higher voltage applications, which increases electric fields to the point where premature breakdown can occur.

Accordingly, a need exists for a BICMOS fabrication technique that permits the fabrication of HV and LV bipolar transistors on the same BICMOS integrated circuit.

SUMMARY OF THE INVENTION

The invention is an HV BICMOS method of fabricating HV (high voltage) bipolar transistors in a BICMOS integrated circuit. Using the HV BICMOS fabrication method, which does not significantly alter normal BICMOS fabrication, a BICMOS circuit can include both high voltage and low voltage bipolar transistors, with the high voltage transistors exhibiting a significantly greater breakdown voltage.

In one aspect of the invention, HV bipolar transistors are fabricated in a BICMOS integrated circuit that uses a semiconductor substrate of a first conductivity type over which is formed an epitaxial layer of a second conductivity type. Within designated HV regions of the substrate, HV wells of the second conductivity type are formed with a dopant concentration comparable to the epitaxial layer. Adjacent to each HV well, at least one collector region of the second conductivity type is formed with a dopant concentration substantially greater than the epitaxial layer.

The epitaxial layer is formed over the substrate including each HV well, thereby forming an HV/epitaxial well. A collector contact region is formed through the epitaxial layer to each collector region.

In each HV/epitaxial well, a base region of the first conductivity type is formed and insulated from the collector contact region. Finally, an emitter region is formed over the base region.

In an exemplary embodiment of the invention, a BICMOS integrated circuit is fabricated with both HV and LV bipolar transistors using a P-type substrate with an N− epitaxial layer. The basic HV BICMOS fabrication technique involves modifying conventional BICMOS fabrication by adding an additional masking/implant procedure to create N− HV/epitaxial wells for the HV transistors (the LV transistors are fabricated conventionally).

Specifically, a first N-type implant covers both HV and LV regions of the substrate (i.e., regions that will be doped either N− or N+). The HV well portion of the HV regions are then masked, and a second N-type implant is performed to form buried N+ collector regions on either side of the N− HV wells, and within the LV regions. These two implants are followed by a conventional thermal drive to achieve the appropriate dopant diffusion and junction profiling.

The N− epitaxial layer is conventionally formed over each N− HV well, forming an N− HV/epitaxial well, and N+ collector contact regions are implanted through the epitaxial layer to the buried N+ collector regions in both the HV and the LV regions. For the HV regions, the effect of this two step N- type implant is to extend the depth of the N— epitaxial region down to around the depth of the buried N+ regions, thereby replacing a higher dopant concentration with a lower dopant concentration, and correspondingly increasing junction breakdown voltage.

The HV and LV transistors are completed with the formation of intrinsic/extrinsic bases and emitters in each HV/epitaxial well and each LV region. In particular, the extrinsic/extrinsic bases for both HV and LV transistors are formed by identical P-type implants—alternatively, the extrinsic bases for the HV transistors can be formed by a deep P-type implant that extends relatively deep into the N— HV/epitaxial well, thereby reducing curvature effects and inhibiting premature breakdown.

The technical advantages of the invention include the following. The HV/LV BICMOS processing technique allows BICMOS integrated circuits to be fabricated with both high voltage and low voltage bipolar transistors, such as for applications as high voltage analog and power devices. Only one additional masking step is required—to differentiate the lower-concentration N— HV wells from the higher-concentration buried N+ regions—and an associated single additional implant step. Fabricating the HV transistors in a relatively low-concentration HV/epitaxial well correspondingly increases the collector-base, collector-emitter, and collector-substrate breakdown voltage. Fabricating the extrinsic base regions with a deep P+ implant that extends into the N— HV/epitaxial well to reduce curvature effects, further enhancing high voltage performance (without significantly affecting emitter-base transit time or transistor switching speed).

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of an exemplary embodiment of the HV BICMOS transistor and the associated method of fabrication is organized as follows:

1. HV BICMOS Transistor
1.1. HV Transistor
1.2. HV and LV Transistors
2. HV BICMOS Fabrication Method
2.1. N+/N— Implants
2.2. HV/Epitaxial Well
2.3 Transistor Formation
3. Conclusion The exemplary HV BICMOS fabrication method is used to fabricate high voltage/high performance transistors in a BICMOS integrated circuit that includes both high voltage and low voltage bipolar transistors.

The basic BICMOS fabrication process is described in the related patent and pending application, the disclosures of which are incorporated by reference. This Detailed Description focuses on the different process steps associated with fabricating HV bipolar transistors.

1. HV BICMOS Transistor. The exemplary HV BICMOS bipolar transistor is fabricated in an HV/epitaxial well that in effect significantly extends the depth of the N—epitaxial layer to replace the buried N+ layer that underlies LV transistors. The effect of the increased depth of the relatively low-dopant-concentration HV/epitaxial well is to substantially increase the collector-base, collector-emitter, and collector-substrate junction avalanche breakdown voltages.

Figure 1:
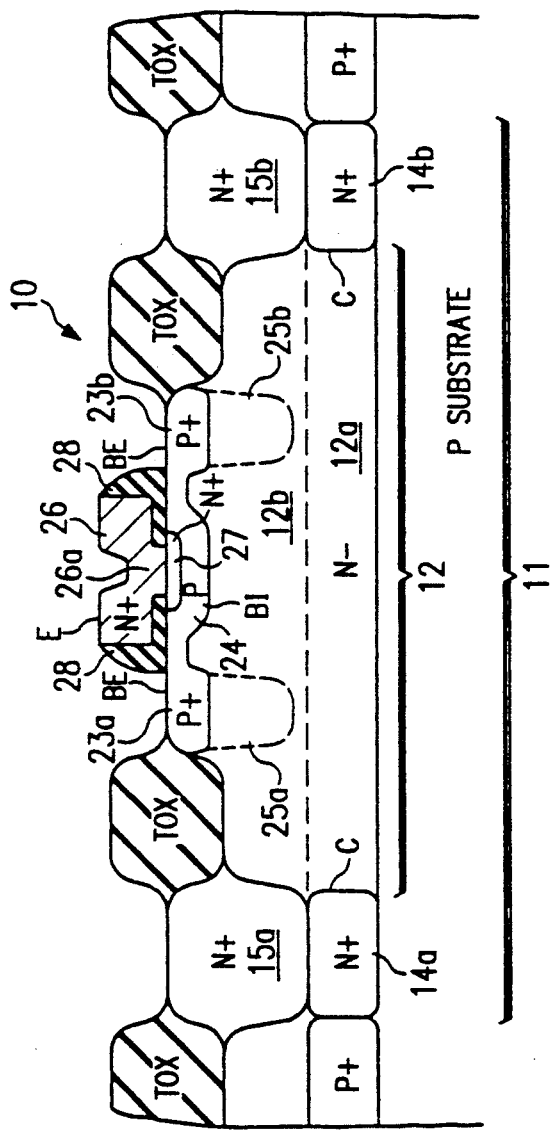
FIG. 1 illustrates an HV (high voltage) bipolar transistor fabricated in a deep N— HV/epitaxial well in accordance with the HV/LV BICMOS fabrication method of the invention.

1.1. HV Transistor. FIG. 1 illustrates the exemplary HV bipolar transistor fabricated in a conventional BICMOS integrated circuit. The integrated circuit is fabricated in a P-type substrate using N— epitaxy.

An HV bipolar transistor 10 is fabricated in an HV region 11 of the substrate, and in particular in an N— HV/epitaxial well 12. Typical N— dopant concentrations are around 1E16 ions per $cm^3$. In comparison, typical N+ dopant concentrations are around 1E1to 1E20 ions per $cm^3$.

The N— HV/epitaxial well 12 includes an N— HV well 12a formed in the substrate, and the overlying portion of the N— epitaxial layer 12b (the broken line is included merely as a means of clarifying the boundary between the substrate and the epitaxial layer). As described in Section 2, the HV well is formed by an N-type implant that is controlled to produce an N— well in the substrate with about the same dopant concentration as the N— epitaxial layer. In effect, this implant extends the depth of the epitaxial layer within the HV region 11.

Adjacent to, and on either side of, the HV well 12a are buried N+ collector regions 14a and 14b formed in the substrate. The regions form the collector for the HV transistor. N+ collector contact regions 15a and 15b extend through the epitaxial layer to provide respective contacts for the buried N+ collector regions 14a and 14b.

The depth of the N- HV/Epitaxial well 12 relative to the N+ collector regions 14a and 14b is a design choice—showing those depths to be about equal is a matter of illustration only.

The transistor base is formed in the epitaxial layer within the HV/epitaxial well 12. The base comprises an extrinsic base BE and an intrinsic base BI, respectively formed by P+ implant regions 23a/23b on either side of a P implant region 24. The P+ extrinsic base regions 23a/23b are insulated from the respective collector contact regions 15a/15b by thick (or field) oxide TOX.

The transistor emitter E is formed by a polysilicon emitter 26 deposited over the base implant region and doped N+, together with an N+ region 27 formed by diffusion from the polysilicon into the intrinsic base region. The polysilicon emitter contact is insulated from the P+ base regions by oxides 28.

Figure 2:
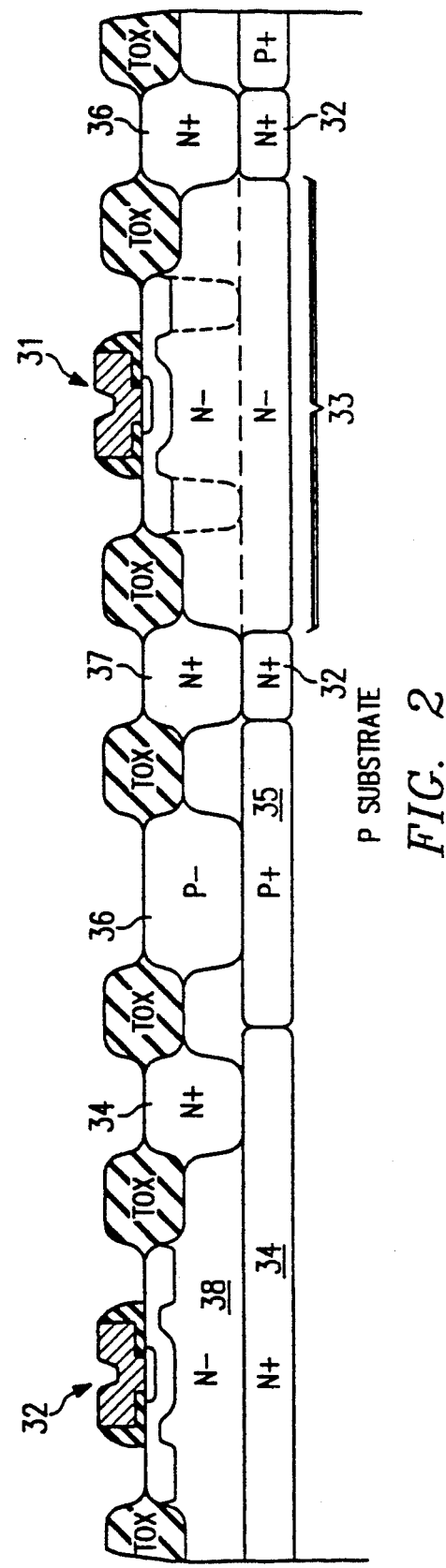
FIG. 2 illustrates both an HV and an LV bipolar transistors.

To further enhance high voltage performance, the P+ extrinsic base regions 23a and 23b can be extended using deep P+ implants 25a and 25b. The optional use of a deep P+ implant to create the extrinsic base regions reduces curvature effects, which correspondingly reduces electric field, and thereby inhibits premature junction breakdown. Because the depth of the intrinsic base is not changed, emitter-base transit time is not significantly affected, so that transistor switching speed does not significantly degrade 1.2. HV and LV Transistors. FIG. 2 illustrates both HV and LV bipolar transistors 31 and 32. The essential difference is that, for the HV transistor, a N− HV/epitaxial well 33 eliminates the buried N+ layer 34 that underlies the LV transistor.

A buried P+ layer 35 isolates the buried N+ collector regions 32 of the HV transistor from the buried N+ collector region of the LV transistor. A P− epitaxial region 36 above the buried P+ layer is used for NMOS fabrication.

The HV transistor 31 is fabricated in the N− HV/epitaxial well 33, with an N+ collector contact region 37 extending through the epitaxial layer to the buried N+ collector region 32. The LV transistor 32 is fabricated in the region 38 of the epitaxial layer above the buried N+ collector region 34, with an N+ collector contact region 39 extending through the epitaxial layer to the buried N+ collector region.

2. HV BICMOS Fabrication Method. FIGS. 3a–3d illustrates various stages in the HV BICMOS method of fabricating the HV bipolar transistor illustrated in FIG. 1. Conventional photolithographic techniques are used. These Figures, and the various layers and regions are not drawn to any absolute or relative scale, but are for illustrative purposes only.

Figure 3A:
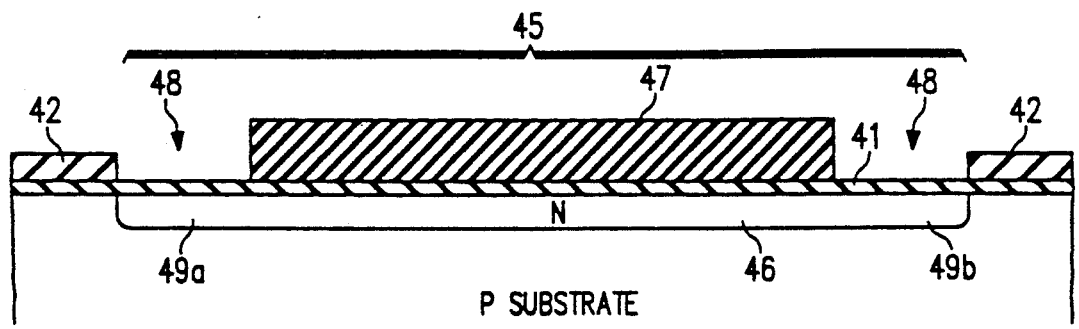
FIGS. 3a–3d illustrate various stages in the fabrication of a HV bipolar transistor.

2.1. N+/N− Implants. Referring to FIG. 3a, the surface of the P substrate is cleaned, and pad oxide is grown to a thickness of about 350 A. A layer of silicon nitride is then deposited over the pad oxide to a thickness of about 1050 A using low pressure chemical vapor deposition.

The oxide/nitride is patterned and plasma etched to remove the nitride layer from those areas into which will be implanted N- type dopant, including an HV region 45 for each HV transistor, which will contain an N− HV well and the adjacent buried N+ collector regions. The buried N+ collector regions for the LV transistors are implanted at the same time.

Two separate implants with a suitable N-type dopant are used—Phosphorous, Arsenic, or Antimony are preferred because of relatively high diffusion rates. A first Phosphorous implant 46 is performed, covering entire HV region. A photoresist mask 47 defines the area of the HV well, leaving exposed the areas 48 that define the buried N+ collector regions. A second Antimony implant 49a/49b is performed at a dose of about 5E15 ions per cm$^3$ and an energy of about 40 KeV, correspondingly increasing the concentration of the dopant in those implant regions (which will become the buried N+collector regions).

Thus, in comparison to the fabrication of LV transistors, the fabrication of the HV transistors, and in particular the formation of the HV wells, requires a single additional mask/implant step to create the concentration differential between the N− HV wells and the N+ collector regions. For the LV transistors, the entire LV region of the substrate is subjected to both implants, forming the underlying buried N+ collector region.

Figure 3B:
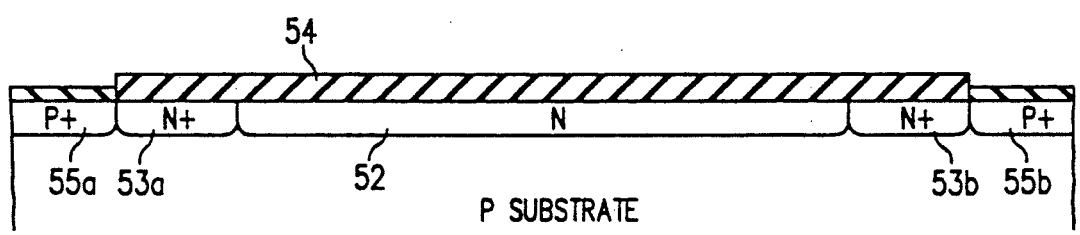

Referring to FIG. 3b, the N-implants are followed by a P- type implant. The low-concentration N- type implant region 52 (which will become the N− HV well) and the adjacent high-concentration N−type implant regions 53a and 53b (which will become the buried N+ collector regions) are cleared of pad oxide, and a blocking oxide 54 is grown to a thickness of about 6000 A, using a thermal oxidation procedure with steam at about 1000° C.

The nitride is then stripped off the areas that define the buried P+ isolation regions, adjacent the high-concentration N-type implant regions 53a/53b. A Boron implant 55a/55b is performed at a dose of about 1E3 ions per cm$^3$ and an energy of about 150 KeV.

Figure 3C:
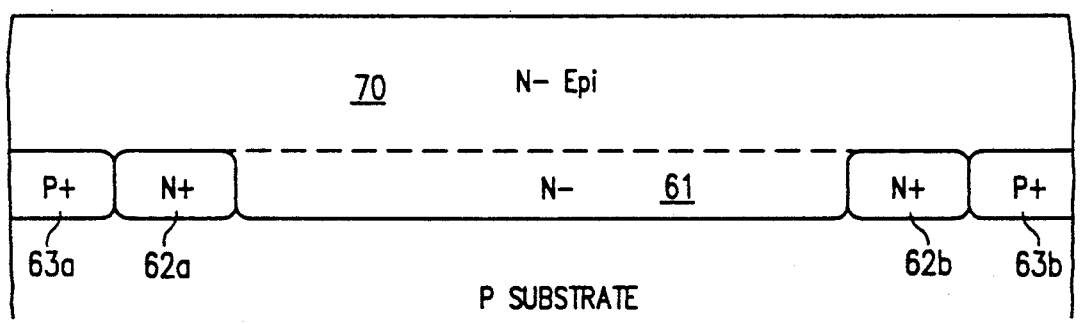

2.2.HV/Epitaxial Well. Referring to FIG. 3c, the two N-type and one P-type implants are followed by a thermal-drive that establishes the depth and concentration of the associated implant regions, as well as the junction profiles. The amount of thermal drive will depend on the amount of implant drive, the desired depth for a region, and the desired concentration for that region.

The surface of the substrate is annealed at about 900° C. in an annealing ambient to provide the desired thermal drive (and to repair implant damage). The thermal drive forms the N− HV well 61, the adjacent buried N+ collector regions 62a/62b, and the buried P+ isolation regions 63a/63b.

The depth of the N− HV well 61 and the adjacent buried N+ collector regions 62a/62b (and the buried P+ regions 63a/63b) are shown to be approximately the same. The relative depths for these regions are a design choice. For example, the depth of the N− HV well can be made deeper than the buried N+ regions by using a relatively high energy first N− implant followed by a relatively low energy second implant in the buried N+ regions.

After thermal drive, the surface of the substrate is subjected to an HF strip and then cleaned in preparation for epitaxial deposition. The N− epitaxial layer 70 is deposited to a thickness of about 1.3–1.5 microns and a concentration of about 1E16 ions per cm$^3$ (approximately 0.5 ohm-cm).

2.3 Transistor Formation. The remaining process steps in transistor fabrication are essentially the same for both HV and LV bipolar transistors, and are described in the related patent and pending application. The only difference is that, for the HV transistor, the P+ extrinsic base regions can be extended further into the N− HV/epitaxial well by a deep P+ implant.

Figure 3D:
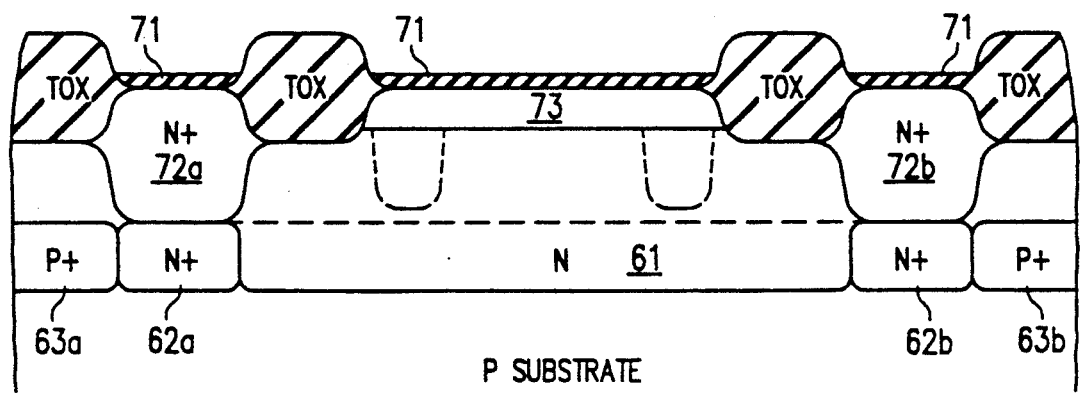

Referring to FIG. 3d, after forming pad oxide 71 and nitride layers (not shown), the nitride is patterned and etched to expose the thick oxide areas. LOCOS oxidation is used to grow thick oxides TOX with a thickness of about 8000 A, using steam at about 920° C. for 35 minutes. Then the remaining nitride is stripped, and pre-gate and gate oxidation procedures are performed.

Next, deep N+ implants are performed at a dose of about 1E16 ions per cm$^3$ and an energy of about 100 KeV. This implant is followed by an anneal at about 1000° C., to create the N+ collector contact regions 72a and 72b.

A base region 73 is formed by a base implant using Boron at a dose of about 1.5E14 ions per cm$^3$ and an energy of about 60 KeV, followed by an anneal at about 900° C. In addition, a VT (voltage threshold) implant may be performed, again using Boron at a dose of about 2.0E11 ions per cm$^3$ and an energy of 50 KeV.

Referring to FIG. 1 the final steps in the fabrication of the HV and LV transistors form the emitters and complete the formation of the base regions.

Emitter E is formed by depositing polysilicon 26, including an emitter contact region 26a that extends through a window in the pad oxide to contact the surface of the substrate above the intrinsic base region 24. An N+ polysilicon implant using Phosphorous is then performed at a dose of about 1.5E16 and an energy of about 80 KeV. Sidewall oxides 28 are formed to insulate the emitter E from the base.

The extrinsic base regions 23a and 23b then receive a P+ implant using Boron at a dose of about 3.0E15 and an energy of about 30 KeV. Alternatively, deep P+ extrinsic base regions 25a and 25b can be formed by increasing the concentration and energy of the implant to about 3E15 ions per cm³ and an energy of about 120 KeV.

An anneal is performed at about 900° C., forming an N+ diffusion region 27 under the emitter contact region 26a, and completing the diffusion and junction profiling of the extrinsic base regions 23a and 23b, and the intrinsic base region 24.

3. Conclusion. Although the Detailed Description of the invention has been directed to certain exemplary embodiments, various modifications of these exemplary embodiments, as well as alternative embodiments, will be suggested to those skilled in the art. For example, the invention has general applicability for fabricating high voltage transistors for BICMOS applications.

It is to be understood that the invention encompass any modifications or alternative embodiments that fall within the scope of the appended claims.

What is claimed is:

1. An HV BICMOS method of fabricating relatively high voltage (HV) bipolar transistors in a BICMOS integrated circuit using a semiconductor substrate of a first conductivity type over which is formed an epitaxial layer of a second conductivity type, comprising the steps:
   forming in each of selected number of HV regions in the substrate an HV well of the second conductivity type with a dopant concentration about the same as the epitaxial layer;
   forming adjacent to each HV well at least one collector region of the second conductivity type with a dopant concentration substantially greater than the epitaxial layer;
   forming the epitaxial layer over the substrate including each HV well, thereby forming an HV/epitaxial well;
   over each collector region, forming in the epitaxial layer a collector contact region extending through the epitaxial layer to the collector region;
   in each epitaxial/HV well, forming a base region of the first conductivity type, insulated from the collector contact region; and
   forming an emitter of the second conductivity type over the base region.

2. The HV BICMOS fabrication method of claim 1, wherein the step of forming a base region comprises the steps:
   forming at least one deep extrinsic base region in the HV/epitaxial well that extends to a substantial depth within the HV/epitaxial well, so as to reduce curvature effects.

3. The HV BICMOS fabrication method of claim 1, wherein the step of forming the HV well, and the step of forming adjacent to each HV well at least one collector region, are accomplished by the substeps of:
   masking the surface of the substrate to expose areas above the HV well and the collector region;
   implanting into the exposed areas a dopant of the second conductivity type;
   masking the surface of the substrate to expose areas above the collector regions;
   implanting into the exposed areas a dopant of the second conductivity type, thereby significantly raising the dopant concentration in the collector region relative to the dopant concentration in the HV well.

4. The HV BICMOS fabrication method of claim 3, further comprising after the second implant step, the step of thermally driving the dopant in the HV well and the collector region to selected respective depths, thereby achieving selected respective concentrations.

5. The HV BICMOS fabrication method of claim 1, wherein the depth of the HV well is substantially the same as the depth of the collector region.

6. The HV BICMOS fabrication method of claim 1, wherein the first conductivity type is P and the second conductivity type is N, and wherein the epitaxial layer and the HV well are doped N− and the collector region is doped N+.

7. An HV/LV BICMOS method of fabricating a BICMOS integrated circuit that includes relatively high voltage (HV) and relatively low voltage (LV) bipolar transistors, which uses a semiconductor substrate of a first conductivity type over which is formed an epitaxial layer of a second conductivity type, comprising the steps:
   forming in each of selected number of HV regions in the substrate an HV well of the second conductivity type with a dopant concentration about the same as the epitaxial layer;
   forming adjacent to each well at least one HV collector region, and forming in each of a selected number of LV regions in the substrate an LV collector region, the HV and LV collector regions being of the second conductivity type with a dopant concentration substantially greater than the epitaxial layer;
   forming the epitaxial layer over the substrate including each HV well, thereby forming an HV/epitaxial well;
   in a portion of each HV and LV collector region, forming in the epitaxial layer a collector contact region of the second conductivity type extending through the epitaxial layer to the collector region;
   in each HV/epitaxial well and over each LV collector region, forming a base region of the first conductivity type, insulated from the collector contact region; and
   forming an emitter of the second conductivity type over the base region.

8. The HV/LV BICMOS fabrication method of claim 7, wherein the step of forming a base region in each HV/epitaxial well is accomplished by:
   forming at least one deep extrinsic base region in the HV/epitaxial well that extends to a substantial depth within the HV/epitaxial well, so as to reduce curvature effects.

9. The HV/LV BICMOS fabrication method of claim 7, wherein the step of forming the HV well, and the step of forming HV and LV collector regions, are accomplished by the substeps of:
   masking the surface of the substrate to expose areas above the, HV well and the HV and LV collector regions;
   implanting into the exposed areas a dopant of the second conductivity type;
   masking the surface of the substrate to expose areas above the HV and LV collector regions;

implanting into the exposed areas a dopant of the second conductivity type, thereby significantly raising the dopant concentration in the HV and LV collector regions relative to the dopant concentration in the HV well.

10. The HV BICMOS fabrication method of claim 9, further comprising after the second implant step, the step of thermally driving the dopant in the HV well and the HV and LV collector regions to selected respective depths, thereby achieving selected respective concentrations.

11. The HV BICMOS fabrication method of claim 7, wherein the depth of the HV well is substantially the same as the depth of the HV collector region.

12. The HV BICMOS bipolar transistor of claim 7, wherein the first conductivity type is P and the second conductivity type is N, and wherein the epitaxial layer and the HV well are doped N− and the collector region is doped N+.

* * * * *